INVENTOR.
HARVARD BROUWER

BY Price & Heneveld

ATTORNEYS

Oct. 15, 1968 H. BROUWER 3,406,351

TRANSFORMERLESS PUSH-PULL TRANSISTOR AMPLIFIER

Filed March [illegible], 1965 2 Sheets-Sheet 2

INVENTOR.
HARVARD BROUWER

BY Price + Heneveld

ATTORNEYS

United States Patent Office 3,406,351
Patented Oct. 15, 1968

3,406,351
TRANSFORMERLESS PUSH-PULL TRANSISTOR AMPLIFIER

Harvard Brouwer, Grand Rapids, Mich., assignor to Lear Siegler, Inc.

Filed Mar. 5, 1965, Ser. No. 437,397
5 Claims. (Cl. 330—15)

ABSTRACT OF THE DISCLOSURE

A transistorized push-pull circuit producing a double-ended or three-terminal output from a two-terminal input, with a single source of operating power, including a first stage comprising a split-load phase inverter for producing the required out-of-phase signals for a pair of symmetrical output stages connected in push-pull, in which feedback is provided in the phase inverter stage to stabilize the same and make its operation independent in variations in the transistor or transistors involved, in which feedback is provided in each of the output push-pull stages to make each half of the output stage independent with respect to the loading of the other half, and in which the biasing is such that the output circuit normally operates in Class B but is automatically changed by the signals supplied to the input thereof to operate in Class AB.

This invention relates to amplifying circuitry of the type having a push-pull output, and more particularly to a new transformerless design for such circuitry having many desired new features.

The push-pull amplifying circuit is of course well known at the present time, and has many desirable features including high gain and large power outputs with very low distortion. Push-pull circuits require phase inversion techniques, however, and this typically involves the use of a center-tapped input transformer. Also, center-tapped output transformers are ordinarily required to provide the three-terminal double outputs which characterize the true push-pull circuit. However, such transformer circuits are completely incompatible with present-day thin-film and integrated packaging techniques for electronic circuits and their components. Accordingly, the use of the basic push-pull circuit has been sharply curtailed in those advanced areas within the art in which size and weight limitations are critical and where thin-film techniques are used extensively, even though the performance of push-pull circuits in this area is definitely to be desired.

Accordingly, it is a major object of the present invention to provide a completely transformerless amplifying circuit providing a true three-terminal push-pull output voltage, and to provide a circuit of this nature which operates from a two-terminal input source and requires only a single source of DC operating voltage.

Another object of the present invention is to provide a transformerless push-pull circuit of the nature described in which each half of the push-pull output voltage is independently controlled, and which will permit the loads connected to each half of the output to be independent of one another.

Still another object of the present invention is to provide a transformerless push-pull circuit of the nature described which further includes provision for increasing the gain of the circuit, in connection with which means are provided to stabilize the gain of the input portion of the circuit so that the same is independent of variations in particular components.

Still another object of the present invention is to provide a transformerless push-pull amplifying circuit whose steady-state or quiescent condition is one of Class B operation in order to realize the operating efficiencies inherent therein, and which automatically changes its operation to Class AB whenever input voltages are applied for amplification.

A further object of the present invention is to provide a push-pull amplifying circuit having the foregoing attributes which utilizes only semi-conductor amplifying devices, and in which all such devices are of the same conductivity type.

A still further object of the present invention is to provide a push-pull amplifying circuit of the type noted whose output transistors are biased through circuitry which includes means for compensating for the base-to-emitter junction of the amplifying transistors.

All of the foregoing objects and advantages, together with other desirable features and aspects of the present invention, will become increasingly apparent upon a thorough consideration of the following specification and the appended claims, particularly when taken in conjunction with the accompanying illustrative drawings setting forth preferred embodiments of the circuit.

Briefly stated, the present amplifying circuit provides a three-terminal push-pull voltage output from a two-terminal input and a single source DC supply without the use of any transformers. The circuit includes a first or input-circuit portion having a pair of impedance elements from which output signals are taken, and switching means connected to the impedances for varying the current flow through them in an inverse manner relative to each other such that the said output signals are directly out of phase with each other. The circuit further includes an output portion which in its essence is comprised of a pair of push-pull connected amplifying means which each receive and separately amplify one of the said phases of the signal from the first circuit portion so as to provide the aforementioned three-terminal push-pull output. The present circuitry also includes desirable feedback networks by which both portions of the amplifier may be stabilized and made independent of variations in particular circuit components such as transistors, and other feedback loops by which each half of the push-pull voltage output may be made independent of the other, so that independent loads may be driven if desired. Other desirable characteristics are also made available by the present invention, as is made apparent in the following detailed description of specific details of this circuitry.

Figure 1:
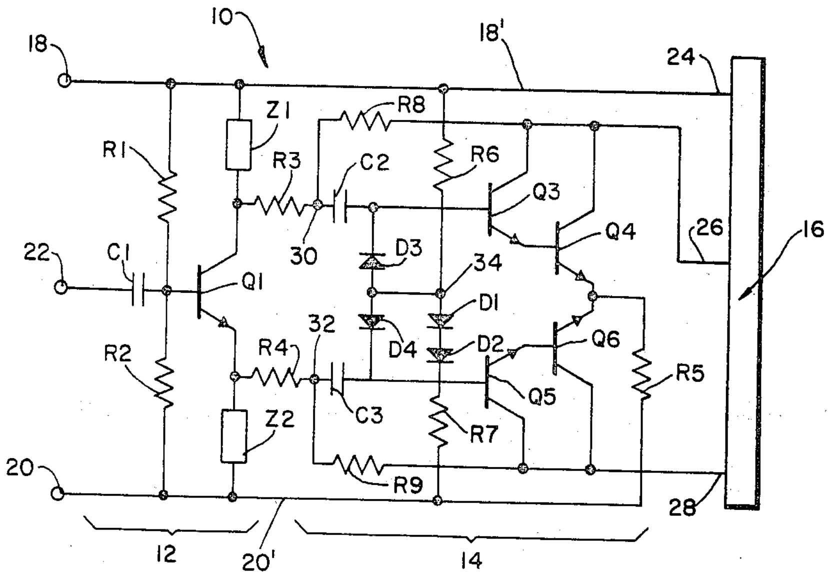
FIG. 1 is a schematic circuit diagram of a first embodiment of the present amplifying circuit.

Referring now in detail to the drawings, the basic amplifying circuit 10 is illustrated by the schematic of FIG. 1. Basically, the circuit 10 includes a first input portion 12 and a second portion 14 providing a three-terminal or double-ended push-pull output which drives a desired three-terminal load 16, such as for example a center-tapped torquer motor for a gyroscope. As will be appreciated, this is a most desirable application for the present amplifying circuit, especially when the same is packaged in micro-circuit form with thin-film circuitry techniques.

The circuit 10 has input terminals 18, 20, and 22. DC power is applied across terminals 18 and 20 plus to minus, respectively, and a desired alternating or time-varying input signal which is desired to be amplified is applied across terminals 22 and 20. The latter terminal connects to conductor 20', which may be considered the system ground. The three-terminal output mentioned is provided at output terminals 24, 26, and 28. It will be observed that output terminal 24 is directly connected to input terminal 18 by a power conductor 18′, and consequently output terminal 24 will always carry a voltage of the same positive magnitude as the DC input. Voltage outputs at terminals 26 and 28, on the other hand, are provided by the push-pull portion 14 of the circuit. As will be subsequently described, each of these output terminals provide amplified phase-sensitive voltage outputs relative to the potential of terminal 24 in response to varying input signals impressed upon input terminal 22.

The input or first circuit portion 12 of the amplifier 10 includes a first transistor Q1 and its environmental components. These include a pair of resistors R1 and R2 which connect the base of transistor Q1 across power conductor 18′ and ground 20′, to establish a base bias voltage, and a coupling capacitor C1, by which the alternating input signals impressed upon terminal 22 are coupled to the base of the transistor. Circuit portion 12 further includes impedances Z1 and Z2, preferably resistive in nature, which connect the collector and the emitter, respectively, of transistor Q1 to the power conductor 18′ and ground 20′.

Transistor Q1 is biased to conduct for all anticipated levels of input signals, and amplifies both the negative and the positive half cycles of these inputs. In so doing, transistor Q1 acts as a switching means between impedances Z1 and Z2 to vary the current flow through them in a manner which is inverse in one as compared to the other. That is, under quiescent conditions in which there is no input signal and the current conducted through the transistor does not vary, there will be a constant voltage drop across each of the impedances. When a time-varying input signal is applied and the transistor amplifies its variations, however, the voltage developed across each of the impedances will vary inversely in magnitude relative to each other. Consequently, the variations in these voltages will be directly out of phase with each other. If impedances Z1 and Z2 are made to be equal, then the varying voltages developed across them will be equal in magnitude, but directly out of phase with each other.

The out-of-phase voltages developed in the first circuit portion 12 in the manner described are coupled to the push-pull circuitry 14 by a pair of identical series RC circuits consisting in one case of a resistor R3 and a capacitor C2 having a common junction point 30, and in the other case of a resistor R4 and a capacitor C3, having a common junction 32. The amplification in the push-pull portion 14 is accomplished by a first pair of direct-coupled transistors Q3 and Q4 and a second pair of similarly coupled transistors Q5 and Q6. The signals developed in first circuit portion 12 are applied by the first coupling network described to the base of transistor Q3, and applied by the second coupling network described to the base of transistor Q5. The emitter of transistor Q3 connects directly to the base of transistor Q4, and the emitter of transistor Q5 connects directly to the base of transistor Q6. The emitters of transistors Q4 and Q6 have a common connection, and are coupled by a suitable emitter-biasing resistor R5 to the ground conductor 20′. It will be noted that the collectors of both transistors Q3 and Q4 are connected directly to output terminal 26, and that the collectors of both transistors Q5 and Q6 are connected directly to output terminal 28. This collector circuitry, together with the direct connection of input power terminal 18 by power conductor 18′ to output terminal 24, and the common connection of the emitters of transistors Q4 and Q6 which has been described, provides the three-terminal push-pull voltage output which has been noted earlier, and this form of circuit configuration is what is intended throughout this application when the phrase "push-pull connected amplifying means" is used.

The operating bias for the bases of the push-pull transistors is supplied from power conductor 18′ through a first resistor R6, a pair of diodes D1 and D2, and a second resistor R7, which are all series-connected between the power conductor and the system ground, as shown. Resistors R6 and R7 establish a desired operating voltage at circuit-connection point 34, and this voltage is applied to the bases of transistors Q3 and Q5, through diodes D3 and D4, respectively. The double-transistor configuration for each of the amplifying halves of the push-pull network 14 provides a very high gain output, but also entails a double base-emitter junction rather than a single one, and it is to compensate for this double junction that the double diodes D1 and D2 are used. The transistors in each half of the push-pull circuit are biased in the foregoing manner at a quiescent level which is at or very near the threshold of conduction, so that the transistors are placed in a Class B steady-state operating mode.

It will be noted that the collectors of transistors Q3 and Q4 are connected not only to output terminal 26, but also to circuit connection point 30 between input resistor R3 and coupling capacitor C2, by means of a resistor R8. Similarly, the collectors of transistors Q5 and Q6 are connected not only to output terminal 28, but also to circuit connection point 32, between input resistor R4 and coupling capacitor C3, by a resistor R9. These connections provide feedback loops by which a portion of the output through the two halves of the push-pull circuit and the load is coupled back to the bases of transistors Q3 and Q5 to vary the operation of the two amplifying devices in accordance with output conditions. That is, the positive bias which is applied to the base of these two transistors through the diode network which has been described maintains coupling capacitors C2 and C3 in a charged condition during normal or quiescent operation. However, the total charge on these capacitors is also a function of both the feedback voltages from resistors R8 and R9 and the input voltages to the push-pull circuit from first circuit portion 12, when an input voltage is applied.

*Operation*

The operation of the entire circuit is as follows. Since the input voltages to the push-pull circuit 14 from the first circuit portion 12 are directly out of phase with each other, when the input is positive at circuit point 30, for example, it is negative at circuit point 32. Accordingly, the positive voltage on the base of transistor Q3 increases, whereas the voltage on the base of transistor Q5 decreases, reflecting the change in condition across capacitors C2 and C3. These voltages drive transistor Q3, and consequently transistor Q4, into conduction, and an output voltage appears at terminal 26 that is negative relative to terminal 24 and varying in accordance with the variations of the input voltage. Conversely, transistors Q5 and Q6, which previously were at threshold condition, are driven into cutoff.

When the input voltage from circuit portion 12 changes to the opposite phase condition, the opposite operation occurs, wherein transistors Q5 and Q6 are driven into conduction to produce an output voltage at terminal 28 that is negative relative to terminal 24. Due to the charge which previously was present across capacitor C2, however, the base of transistor Q3 loses its positive bias at a time rate determined by the resistance of the capacitor discharge path through diode D3. Accordingly, the amplifying portion composed of transistors Q3 and Q4 does not immediately go to cutoff, but operates under Class AB conditions to produce an output wave form of absolute minimum distortion.

Bias condition at the base of each of the push-pull transistors Q3 and Q5 are, in addition to the conditions described above, also a function of the negative voltage fed back through resistors R8 and R9, respectively. Variations in the voltage dropped across either half of the load will effect a corresponding variation in the voltage developed across either of the feedback resistors and applied to the base of transistors Q3 or Q5. For example, a reduction in the load voltage of one of the push-pull circuit halves results in an immediate and corresponding reduction in the feedback voltage of that half, and a consequent increase in the positive bias applied to the base of the affected transistor to increase conduction through the transistor and increase the voltage applied to the load accordingly. As will be understood, the opposite condition occurs in a similar manner, and consequently the voltage across each half of the output is individually controlled, irrespective of the mutual coupling factor between the halves of the load. This will permit the use of completely independent loads for the two halves, if this operation is desired. Additionally, the biasing of the output transistors provides the minimum power consumption and maximum efficiency advantages characteristic of Class B operation whenever there is no AC input voltage and the system is quiescent, while simultaneously and automatically providing for the improved wave form characteristics of Class AB operation whenever an alternating input voltage is applied.

*Modifications*

Figure 2:
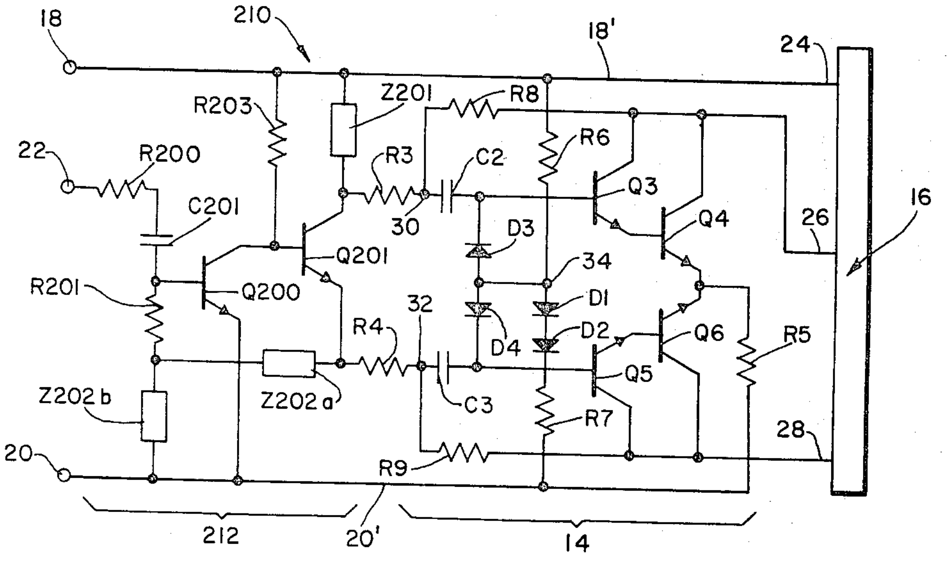
FIG. 2 is a schematic circuit diagram of a second embodiment of the present amplifying circuit.

The circuit illustrated in FIG. 2 is basically the same as that of FIG. 1, and has the same input and output terminals and the same push-pull circuit portion 14, similar elements being given the same designations as in FIG. 1 and in the foregoing description. However, the circuit of FIG. 2 has a somewhat modified input circuit portion, which is designated 212.

Input circuit 212 includes a pair of transistors Q200 and Q201, by which the gain of the input circuit is greatly increased. As in the case of the circuit of FIG. 1, an alternating input is applied between terminals 22 and 20, and this signal is coupled to the base of the first transistor Q200, through a resistor R200 and a capacitor C201. Transistor Q200 is connected to supply-voltage conductor 18′ by a collector resistor R203, and its emitter is connected directly to the system ground conductor 20′.

First transistor Q200 amplifies the input signals, and applies them directly to the base of second transistor Q201. This second transistor operates basically the same as transistor Q1 of FIG. 1, in that its collector includes a first impedance Z201 by which it is connected to power conductor 18′, and its emitter includes a like impedance by which it is connected to ground conductor 20′. In this case, however, the emitter impedance is either two separate similar components Z202*a* and Z202*b*, or else a center-tapped equivalent.

Transistor Q201 effects further amplification of the input signals, and in the same manner as in FIG. 1, provides two directly out-of-phase time-varying output signals which are coupled to the push-pull transistors Q3 and Q5 by the two networks composed of resistor R3 and capacitor C2, and resistor R4 and capacitor C3, respectively. From this point, the output portion of the circuit operates in the same manner as the output portion of the circuit of FIG. 1.

It is to be noted that a resistor R201 couples the base of input transistor Q200 to the junction of impedances Z202*a* and Z202*b*, which are in the emitter circuit of transistor Q201. This arrangement provides a feedback loop by which a portion of the amplified alternating voltage from transistor Q201 is coupled back to the base of transistor Q200, in the form of negative feedback. This stabilizes the operation of the entire first circuit portion 212, and provides a stable value of gain between the input voltage applied to terminal 22 and the resulting amplified voltage on the emitter of transistor Q201 that is essentially independent of variations in the gain of the individual components themselves.

Figure 3:
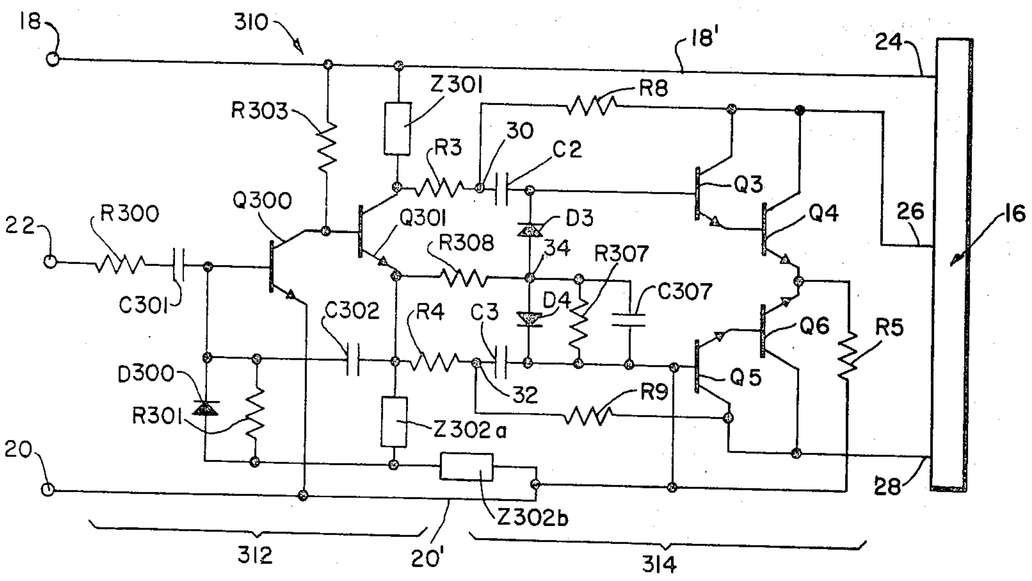
FIG. 3 is a schematic circuit diagram of a third embodiment of the present amplifying circuitry.

A third embodiment of the present invention is seen in FIG. 3. Like the circuits in FIGS. 1 and 2, this one includes a first portion, which is designated 312, and a push-pull output portion, designated 314. Input portion 312 is very much like input portion 212 of FIG. 2, and includes a pair of transistors Q300 and Q301 having interconnecting circuitry that is essentially the same as that of FIG. 2. The circuit of FIG. 3 includes in addition, however, a capacitor C302 which connects the emitter of transistor Q301 directly to the base of transistor Q300, and it also includes a diode D300 which is connected directly across base resistor R301 of transistor Q300. Capacitor C302 acts as a separate feedback loop to further stabilize the operation of this first circuit portion and to provide against any possibility of oscillation in the event that extremely high gain transistors are used for elements Q300 and Q301. As for diode D300, it is to be observed that if the input circuitry 312 is saturated and the input voltage applied to terminal 22 continues to increase positively, the base of transistor Q300 will draw a small amount of current flow to equalize the continuing input. If the analogous condition should occur for negative-going inputs, however, no base current can flow. Consequently, diode D300 is included in this circuit to bypass the increasingly negative input signals, and so balance the operation of the circuit.

The push-pull output portion 314 of the circuit of FIG. 3 is basically the same as circuit portions 14 of FIGS. 1 and 2, except that it is biased somewhat differently. In this case, there is no connection of circuit point 34 to supply conductor 18′, and the two diodes designated D1 and D2 and the resistor designated R6 of the previous circuits are all omitted. Instead, bias for the output transistors is derived by the resistive network consisting of resistors R307 and R308, which interconnect the emitter of transistor Q301 of the input circuit with circuit connection point 34 and the system ground 20′. In this configuration, a capacitor C307 is preferably added in shunt across resistor R307 to stabilize the bias voltage present at connection point 34 and, consequently, to stabilize the bias on the base of the push-pull transistors Q3 and Q4, and Q5 and Q6, by bypassing alternating or time-varying signals past resistor R307. In other respects, the operation of the circuit in FIG. 3 is the same as that set forth previously, including the stabilization of the gain in input circuit 312 by the negative feedback through resistor R301, which has been described in connection with FIG. 2.

Having now described in detail the components and the circuitry forming preferred and alternate embodiments of the present novel transformerless push-pull amplifying network, and also having explained the operation of each portion of the various circuits, it may be that those skilled in the art will conceive of certain variations and modifications, which nonetheless incorporate the spirit of the invention and are based upon the concept underlying it. Such variations and modifications are therefore to be considered as falling within the scope of the invention as set forth in the claims appended below, unless these claims by their language expressly state otherwise.

I claim:

1. A transformerless amplifying circuit for providing a three-terminal push-pull voltage output from a two-terminal input and a single source DC supply comprising: a first circuit portion having a pair of input leads for receiving two-terminal time-varying input signals; said first circuit including a pair of impedance elements across which time-varying output signals are developed and switching means connected to receive said input signals and coupled to said impedance elements for varying current flow therethrough inversely relative to each other in accordance with the time variations of said input signals, such that said output signals are directly out of phase with each other due to said switching variations; said first circuit switching means including a first transistor for receiving and amplifying said input signals and a second transistor having base, emitter and collector electrodes, said second transistor coupled by its base to said first transistor to receive the signals amplified thereby and also connected across said DC supply by different ones of said impedance elements connected to its emitter and collector electrodes respectively; said first circuit portion further including means for feeding back a portion of the said output signals of said second transistor and its impedance elements to the input of said first transistor, whereby the gain of the first circuit portion is stabilized and made independent of variations in the characteristics of the individual transistors themselves; and an output circuit portion connected to said first circuit portion; said output circuit including paired, push-pull connected amplifying means which each receive and separately amplify one of said signal phases so as to provide the said three-terminal push-pull output.

2. A transformerless amplifying circuit for providing a three-terminal push-pull voltage output from a two-terminal input and a single source DC supply comprising: a first circuit portion having a pair of input leads for receiving two-terminal time-varying input signals; said first circuit including a pair of impedance elements across which time-varying output signals are developed and switching means connected to receive said input signals and coupled to said impedance elements for varying current flow therethrough inversely relative to each other in accordance with the time variations of said input signals; said output signals from said first circuit portion impedance elements being directly out of phase with each other due to said switching variations; an output circuit portion including paired, push-pull connected amplifying means, each connected to opposite phases of said first circuit output signals through a resistive element and a coupling capacitor; and circuit means for biasing each of said amplifying means by said DC supply such that the said capacitor in each is charged during the push-pull half-cycle that each conducts but is discharged by the succeeding opposite phase half-cycle of said first circuit output signals in an amount sufficient to bias the particular amplifying means out of operation in a predetermined time and thus cause said output circuit to normally operate Class B but to be automatically changed by said signals to Class AB operation.

3. The circuit of claim 2, further including circuit means for feeding a portion of the output of each of the push-pull amplifying means back to its input, whereby the said discharge of said capacitors and consequent biasing of said amplifying means is additionally caused by said feedback.

4. A transformerless amplifying circuit for providing a three-terminal push-pull voltage output from a two-terminal input and a single source DC supply comprising: a first circuit portion having a pair of input leads for receiving two-terminal time-varying input signals; said first circuit including a pair of impedance elements across which time-varying output signals are developed and switching means connected to receive said input signals and coupled to said impedance elements for varying current flow therethrough inversely relative to each other in accordance with the time variations of said input signals; said output signals from said first circuit portion impedance elements being directly out of phase with each other due to said switching variations; an output circuit portion connected to said first circuit portion, said output circuit including paired, push-pull connected amplifying means which each receive and separately amplify one of said signal phases so as to provide the said three-terminal push-pull output; and circuit means for feeding a portion of the output of each of the push-pull amplifying means back to its input; said feedback circuit means making each half of the said push-pull output independently controlled relative to the other half, whereby a load connected to one half of said output may be independent from a load connected to the other half.

5. The push-pull circuit of claim 4, wherein said first circuit switching means includes a first amplifying transistor for receiving said input signals and a second transistor having base, emitter and collector electrodes; said second transistor coupled by its base to said first transistor to receive the signals amplified thereby and also connected across said DC supply by different ones of said impedance elements connected to its emitter and collector electrodes respectively; and wherein said first circuit portion further includes means for feeding back a portion of the said output signals of said second transistor and its impedance elements to the input of said first transistor, whereby the gain of the first circuit portion is stabilized and made independent of variations in the characteristics of the individual transistors themselves.

References Cited

UNITED STATES PATENTS

| | | | |
|---|---|---|---|
| 2,815,407 | 12/1957 | Hafler | 330—81 |
| 3,223,933 | 12/1965 | Fond et al. | 330—30 |

OTHER REFERENCES

Radio-Electronics, October 1963, pp. 32–33, L. E. Geisler.

RCA Technical Notes, August 1957, A. Aronson and F. Putzrath.

ROY LAKE, *Primary Examiner.*

S. H. GRIMM, *Assistant Examiner.*